(12) United States Patent
Jin

(10) Patent No.: US 8,937,008 B2
(45) Date of Patent: Jan. 20, 2015

(54) APPARATUS AND METHOD FOR PLACING SOLDER BALLS

(75) Inventor: Yonggang Jin, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/340,275

(22) Filed: Dec. 29, 2011

(65) Prior Publication Data

US 2013/0171816 A1 Jul. 4, 2013

(51) Int. Cl.
  *H01L 21/44* (2006.01)
  *H01L 23/00* (2006.01)
(52) U.S. Cl.
  CPC ....... *H01L 24/11* (2013.01); *H01L 2924/00014* (2013.01); *H01L 2224/131* (2013.01); *H01L 2924/014* (2013.01); *H01L 2224/11334* (2013.01); *H01L 24/742* (2013.01); *H01L 2224/11005* (2013.01); *H01L 2224/11849* (2013.01); *H01L 24/13* (2013.01)
  USPC .................... 438/613; 438/614; 257/E21.589
(58) Field of Classification Search
  CPC ....... H01L 24/11; H01L 24/13; H01L 24/742; H01L 2224/11005; H01L 2224/11334; H01L 2224/11849; H01L 2224/131; H01L 2924/00014; H01L 2924/014
  USPC .......... 438/614, 615, 612, 613; 257/E21.508, 257/E21.589
  See application file for complete search history.

(56) References Cited

U.S. PATENT DOCUMENTS

| 6,036,787 A * | 3/2000 | Bennett et al. .................. 134/21 |
| 6,253,992 B1 | 7/2001 | Fjelstad |
| 6,461,953 B1 * | 10/2002 | Sakuyama et al. ............ 438/612 |
| 6,720,244 B2 * | 4/2004 | Tong et al. .................... 438/613 |
| 6,940,169 B2 | 9/2005 | Jin et al. |
| 7,597,233 B2 * | 10/2009 | Sakaguchi et al. .............. 228/41 |
| 2003/0164395 A1 * | 9/2003 | Tong et al. ................. 228/123.1 |
| 2005/0085061 A1 * | 4/2005 | Wu et al. ....................... 438/613 |
| 2009/0294516 A1 * | 12/2009 | Sawa et al. .................... 228/246 |

OTHER PUBLICATIONS

Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.
Jin, "Semiconductor Package With Improved Pillar Bump Process and Structure," U.S. Appl. No. 13/232,780, filed Sep. 14, 2011, 24 pages.

* cited by examiner

*Primary Examiner* — Michael Trinh
(74) *Attorney, Agent, or Firm* — Seed IP Law Group PLLC

(57) ABSTRACT

A system and process for forming a ball grid array on a substrate includes defining a plurality of openings in a resist layer on the substrate, and forming a plurality of openings in the resist layer, each positioned over a contact pad of the substrate. Flux is then deposited in the openings, and solder balls are positioned in each opening with the flux. Solder bumps are formed by reflowing the solder balls in the respective openings. The resist layer is then removed, leaving an array of solder bumps on the substrate. The flux can be deposited by depositing a layer of flux, then removing the flux, except a portion that remains in each opening. Solder balls can be positioned by moving a ball feeder across the resist layer and dropping a solder ball each time an aperture in the ball feeder aligns with an opening in the resist layer.

15 Claims, 9 Drawing Sheets

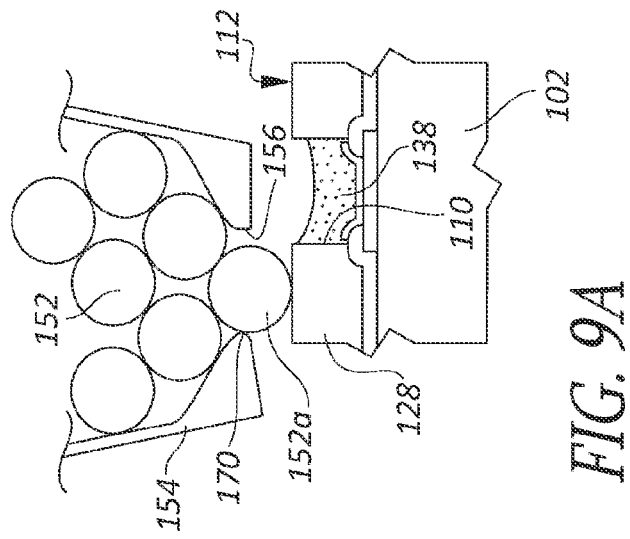
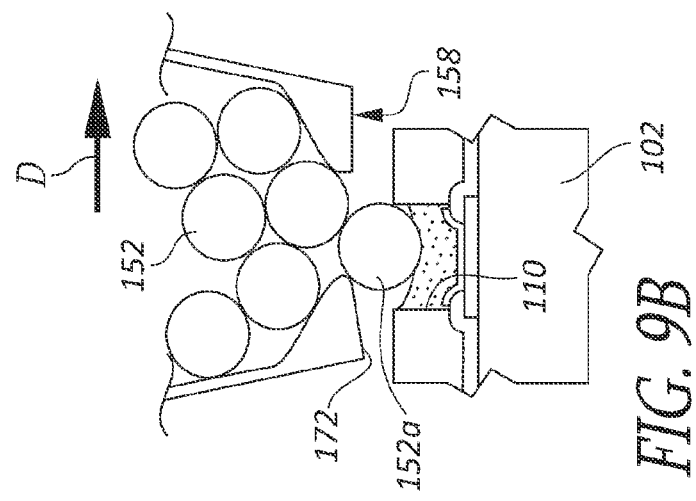
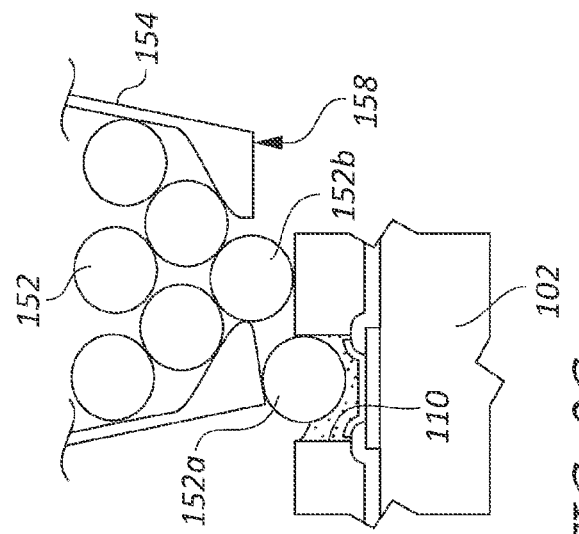
FIG. 9A
FIG. 9B
FIG. 9C

US 8,937,008 B2

APPARATUS AND METHOD FOR PLACING SOLDER BALLS

BACKGROUND OF THE INVENTION

1. Technical Field

Embodiments of the present disclosure are related to the formation of ball grid arrays in and on semiconductor packages, and in particular, to methods and mechanisms for positioning solder balls, especially in relation to very fine pitch arrays.

2. Description of the Related Art

Ball grid arrays are used in many kinds of semiconductor device packages, both internally and externally. Many different systems and processes have been developed for positioning the solder balls on the devices, including pick-and-place systems, vacuum devices, stencils, solder paste printing, and plating operations. As technologies have improved, and the pad pitch of arrays has reduced, it has become more and more challenging to accurately and reliably position solder balls on contact pads to form a ball grid array.

FIG. 1 is taken from U.S. Pat. No. 6,253,992 to Fjelstad, issued Jul. 1, 2001, and shows one known system for placing solder balls. The system depicted includes a stencil 10 having a plurality of holes arranged to correspond to the arrangement of contacts on a chip on which solder balls are to be positioned. An escapement element 26 that includes a reservoir defined by side walls 24 rests on the stencil 10. The escapement element 26 also has a plurality of holes that are arranged to correspond to the holes of the stencil 10, so that when the reservoir and the stencil are properly positioned relative to each other, each hole of the stencil aligns with a corresponding one of the holes of the escapement element, so that a solder ball 16 can drop from the reservoir through the holes of both the escapement element and the stencil. An actuator mechanism 40 is coupled to both the escapement element 26 and the stencil 10, and is configured to move the escapement element relative to the stencil, so as to bring the holes of the respective elements into and out of alignment. Standoffs 20 on the bottom of the stencil 10 maintain a selected spacing between the stencil and an underlying surface. The stencil 10 is linked to a chip support 42 to enable proper positioning of the stencil relative to the contact pads of a chip.

In operation, the actuator 40 holds the escapement element 26 out of alignment with the stencil 10 while a semiconductor chip 50 is positioned on the support 42. The escapement/stencil assembly is then lowered onto the front surface 54 of the chip 50 with the holes of the stencil 10 positioned above the contacts 52 of the chip. The actuator 40 moves the escapement element 26 into alignment with the stencil 10 so that a solder ball 16 drops through each of the holes onto the corresponding contact 52, where it is held in place by a thin layer of flux previously deposited over each contact. The standoffs 20 hold the stencil 10 at a height that permits only one solder ball 16 to drop from each hole. The actuator 40 then moves the escapement element 26 out of alignment, closing the holes, and the assembly is lifted from the chip 50 and the process repeats.

The process described above is one of many that are employed to emplace solder balls. Stencils similar to the stencil 10 of FIG. 1 are also used in various other processes for ball placement.

BRIEF SUMMARY

A method may be summarized as including on a substrate that includes a plurality of contact pads positioned on a surface thereof, positioning a resist layer on the surface of the substrate; defining a plurality of openings in the resist layer, each opening positioned over a respective one of the plurality of contact pads; depositing flux paste in each of the plurality of openings; positioning a solder ball in each of the plurality of openings in contact with the flux paste deposited in the respective opening; forming solder bumps on each of the plurality of contact pads by reflowing the plurality of solder balls in the respective openings; and removing the resist layer after reflowing the solder balls. The depositing flux paste may include depositing a layer of flux paste over substantially an entire surface of the resist layer, and removing flux paste from the surface of the resist layer except a portion of the flux paste that remains in each of the plurality of openings. The depositing a layer of flux paste may include drawing flux paste across the surface of the resist layer with a squeegee.

The method may include positioning sealing ridges on the surface of the resist layer, followed by the drawing flux paste across the surface of the resist layer, a thickness of the layer of flux paste being defined by a height of the sealing ridges above the surface of the resist layer. The depositing a layer of flux paste may include applying flux paste in a spin coat process. The depositing a layer of flux paste may include applying flux paste in a spray process. The removing flux paste from the surface of the resist layer may include moving a cleaning mechanism across the substrate, with a continuous web of a cleaning material being passed over the surface of the resist layer and drawing away the flux paste. The positioning a solder ball in each of the plurality of openings may include moving a ball feeder across the substrate, the ball feeder having a plurality of apertures in a line, spaced apart a distance that corresponds to a spacing, in one dimension, of the contact pads of the substrate, and dropping a single solder ball in each of the plurality of openings in the resist layer as the ball feeder moves across the respective openings.

The method may include positioning a plurality of sealing ridges on the surface of the resist layer, and wherein the moving a ball feeder across the substrate comprises positioning the ball feeder to span at least two adjacent ones of the plurality of sealing ridges and moving the ball feeder along the sealing ridges over the resist layer. The positioning a solder ball in each of the plurality of openings in contact with the flux paste may include dropping a solder ball into each of the plurality of openings, and pressing the solder ball into the flux paste positioned in the respective opening.

A system may be summarized as including a ball feeder including a reservoir sized to receive a plurality of solder balls, the reservoir defined by sides and a bottom; a plurality of openings in the bottom of the ball feeder, spaced in a single row a distance apart that corresponds to a spacing of columns of contact pads of a selected substrate; and a structure configured to enable translation of the ball feeder along a line that lies parallel to an underlying substrate.

The system may include a substrate having a resist layer positioned on a surface thereof, the resist layer having a plurality of openings positioned over respective contact pads of the substrate.

The system may include a plurality of sealing ridges positioned on the resist layer and extending parallel to at least one axis, the ball feeder being configured to extend between two of the sealing ridges and to slide along the sealing ridges over the resist layer. The substrate may include a plurality of arrays of contact pads, each array having a respective plurality of contact pads, the sealing ridges being positioned to enable the ball feeder to move across each of the plurality of arrays in succession.

A method may be summarized as including forming a ball grid array on a semiconductor device, including: positioning a resist layer on a substrate of the semiconductor device; defining a plurality of openings in the resist layer; positioning a solder ball in each of the plurality of openings; and forming a solder bump on a contact pad corresponding to each of the plurality of openings by reflowing the plurality of solder balls in the respective openings.

The method may include depositing flux in each of the plurality of openings prior to positioning a solder ball in each of the plurality of openings. The depositing flux may include depositing a layer of flux over the resist layer, and cleaning flux from a surface of the resist layer while leaving flux in each of the openings. The positioning a solder ball in each of the plurality of openings may include moving a ball feeder across the resist layer so that feed apertures of the ball feeder align, in sequence, with individual rows of the openings.

BRIEF DESCRIPTION OF THE SEVERAL VIEWS OF THE DRAWINGS

FIGS. 9A-9C show, in enlarged diagrammatical side view, a sequence of steps, according to an embodiment.

DETAILED DESCRIPTION

Figure 1:
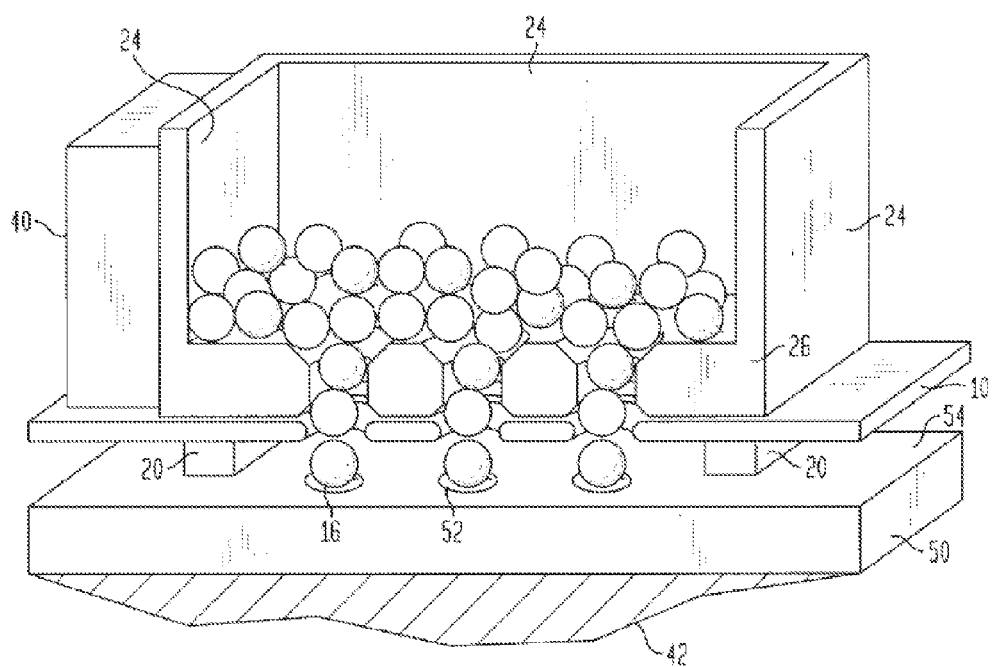
FIG. 1 is a diagrammatic, partially cutaway perspective view depicting an apparatus for placing solder balls according to known art.

The inventor works with semiconductor packaging systems, including systems for producing ball grid arrays. One problem the inventor has encountered is that, as ball pitch is continually reduced, the thickness of the stencils used to control placement must also be reduced. Referring again to FIG. 1, in order for the prior art system to operate properly, a sum of the thicknesses of the stencil 10 and the standoffs 20 cannot be more than about 1.5 times the diameter of the solder balls 16. At greater thicknesses, the mechanism will tend to force a second solder ball out of the holes as the actuator 40 moves the escapement element out of alignment to close the holes. Furthermore, the standoff alone is preferably equal to or greater than the ball diameter to permit a ball to fully exit. Thus, the thickness of the stencil should preferably be half or less than the diameter of a solder ball. This becomes impractical as the size of solder balls continues to diminish.

In some systems, a metal stencil is used to control a deposit of solder paste, which is heated and reflowed to form solder balls or bumps. In these cases, as well, the thickness of the stencil must be less than the pitch value because the volume of solder is determined by the thickness. If too much solder is used, it can easily bridge to an adjoining solder ball. An excessively thick stencil would produce balls that were too large for a given pitch.

Ball grid arrays of less than 300 μm (0.3 mm) are in commercial use. The ball diameter for a given pitch is generally no more than around 60% of the pitch value. Thus, the ball diameter for a 300 μm pitch is generally less than 180 μm. Currently, arrays using a ball pitch of less than 100 μm, and ball diameters of less than 50 μm are known.

As stencil thickness drops below around 100 μm, the stencil becomes increasingly difficult to use, becoming very fragile, with a tendency to wrinkle and tear. The inventor has determined a technique by which solder balls of less than 50 μm can be emplaced without a stencil, eliminating many of the problems associated with producing extremely fine-pitch arrays.

In the disclosure that follows, embodiments will be described with reference to a semiconductor material wafer substrate with a plurality of integrated circuits formed thereon, although details of the circuits are not shown or described. Structures and methods will be disclosed for positioning solder balls on contact pads to produce a plurality of ball grid arrays on the wafer, which is subsequently singulated to produce a plurality of semiconductor chips, each having one of the plurality of integrated circuits, and an associated one of the plurality of ball grid arrays. Nevertheless, as used in the claims, the term substrate can be read generically as referring to any structure on which solder balls may be used, including, for example, a semiconductor material wafer, a reconstituted wafer, a chip carrier, a semiconductor package, a redistribution layer, a fan-out layer, a semiconductor chip, an interposer layer, and a circuit connector. Likewise, ball grid array can be read broadly as referring to any circuit connector on which one or more solder balls or bumps are pre-positioned to provide an electrical connection between two structures.

Figure 2:
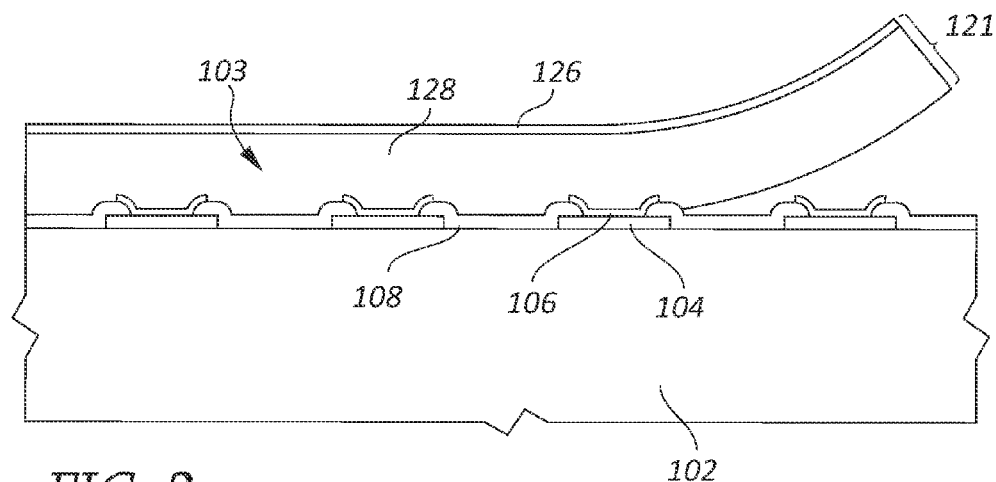
FIGS. 2, 3, 5-7, 10 and 11 are diagrammatic side views of a substrate on which an array of contact pads is positioned, showing a process for placement of solder balls, at respective stages, according to an embodiment.

FIG. 2 is a diagrammatic side view of a substrate 102 on which an array 103 of contact pads 104 is positioned. Also shown is an insulation layer 108 with openings over the contact pads 104, and under-bump metallics (UBM) 106 positioned over the contact pads 104.

Figure 3:
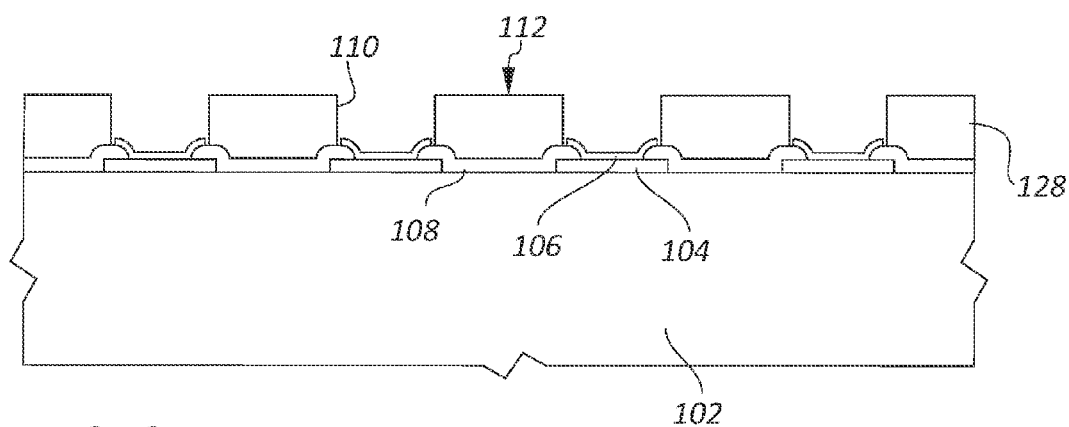

As shown in FIGS. 2 and 3, a dry film resist 121, comprising a support layer 126 and a resist layer 128, is positioned on the substrate 102. The dry film resist 124 is patterned according to known processes, during which the support layer 126 is removed to expose a top face 112 of the resist layer 128, and openings 110 are formed in the resist layer 128 over the contact pads 104. According to an embodiment, a thickness of the resist layer 128 is between about half the diameter of the solder balls that are to be emplaced, and about twice the diameter. According to a preferred embodiment, the thickness of the resist layer 128 is about equal to the diameter of the solder balls.

As an alternative to dry film resist 121, any appropriate resist layer can be used, including those formed by spin coat or spray processes, such as are well known in the art.

Figure 4:
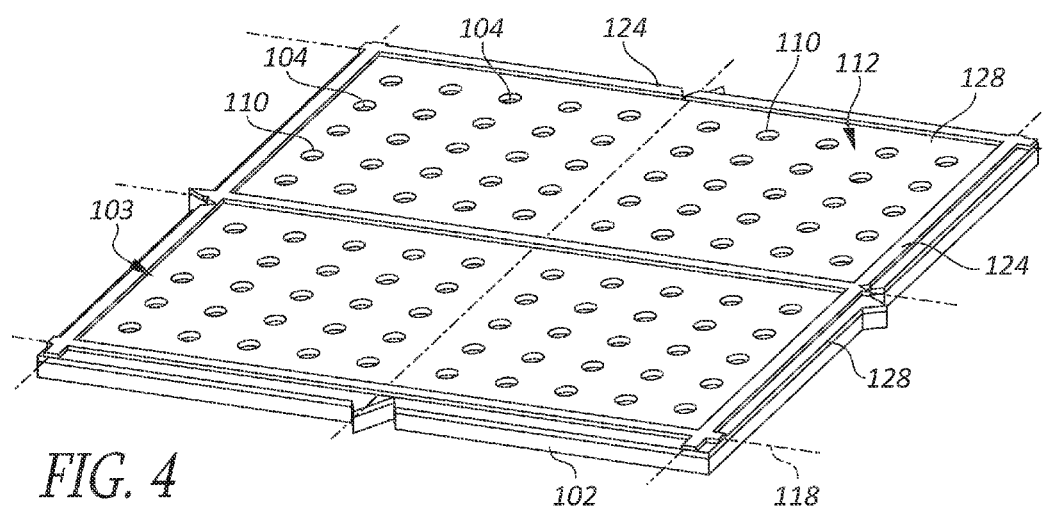
FIG. 4 is a diagrammatical perspective view of a portion of the substrate of FIG. 2 at a stage of the process

FIG. 4 is a perspective view of a portion of the substrate 102, showing the openings 110 in the resist layer 128. Phantom lines 118 indicate the kerf lines where the substrate will eventually be cut into individual dice, each having an array 103 of contact pads 104. Sealing ridges 124 are positioned to extending along kerf lines 118 and between the arrays 103 of contact pads 104. For reasons that will be discussed later, the height—i.e., thickness—of the sealing ridges 124 is preferably about half the diameter of the solder balls that are to be emplaced. Thus, assuming, for example, a ball diameter of about 50 μm, the sealing ridges 124 are about 25 μm in height.

According to an embodiment, a sealing ridge is positioned only around the perimeter of the substrate 102, forming, in the case of a semiconductor wafer, a sealing ring. According to another embodiment, sealing ridges are provided only along kerf lines that extend parallel to a first axis, with none extending in the transverse axis.

The seal ridges 124 can be positioned on the substrate 102 by any appropriate process. The material of the seal ridges 124 is not of particular importance, except that it should preferably be sufficiently rigid to maintain its height during the operations described below. The seal ridges 124 can, for example, comprise a second resist layer that is deposited and patterned over the resist layer 128. Alternatively, the seal ridges can be formed separately, and transferred to the substrate using a transfer liner.

Figure 5:
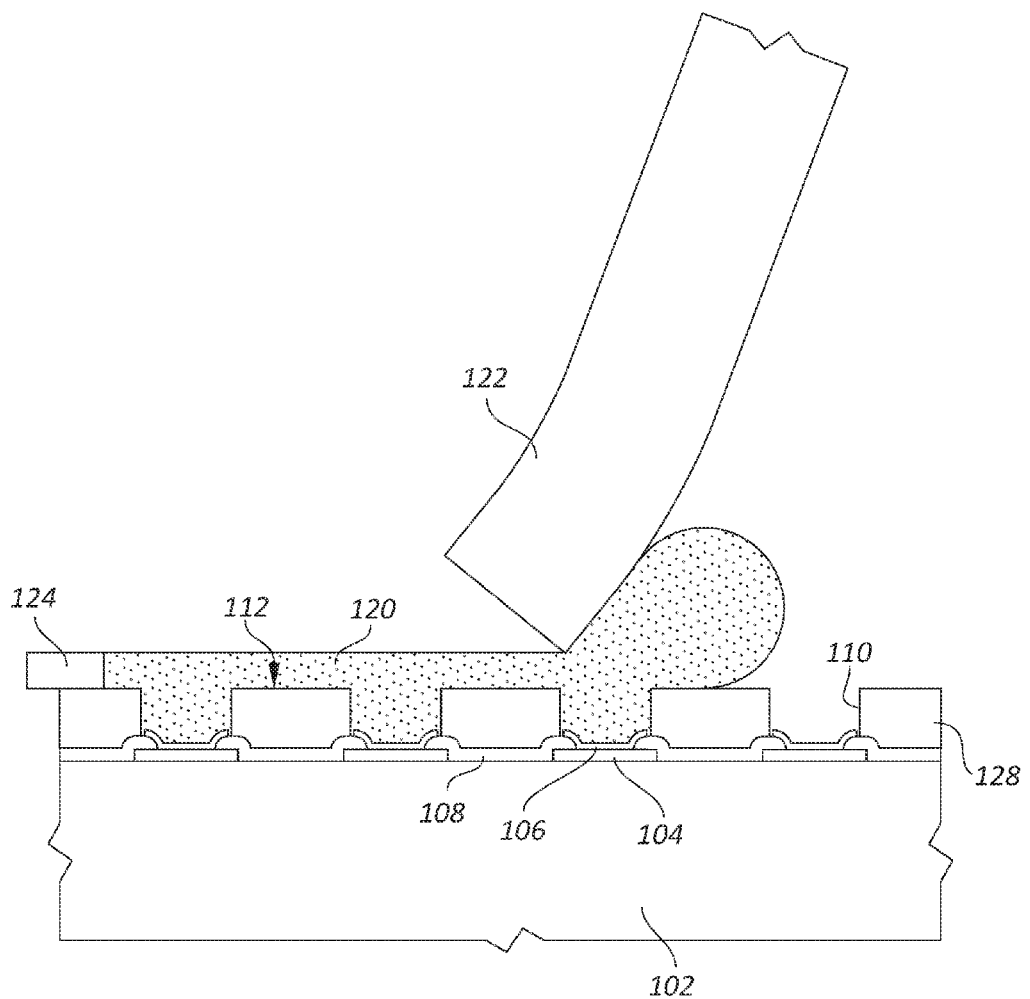

As shown in FIG. 5, flux paste 120 is spread over the top face 112 of the resist layer by a squeegee 122 or doctor blade. In spreading the flux 120, the squeegee 122 extends a distance exceeding at least the distance between pairs of the sealing ridges 124 across the wafer in order to contact the sealing ridges on opposite sides of the arrays of contact pads 104. Preferably, the squeegee 122 extends across the entire substrate 102, and therefore bridges over a number of the sealing ridges 124. The sealing ridges 124 maintain a selected spacing between the squeegee 122 and the top face 112 of the resist layer 128, and serve to protect the resist layer 128 from damage by the squeegee 122 as it passes, and also to control the amount of flux paste 120 that is deposited on the substrate 102.

Figure 6:
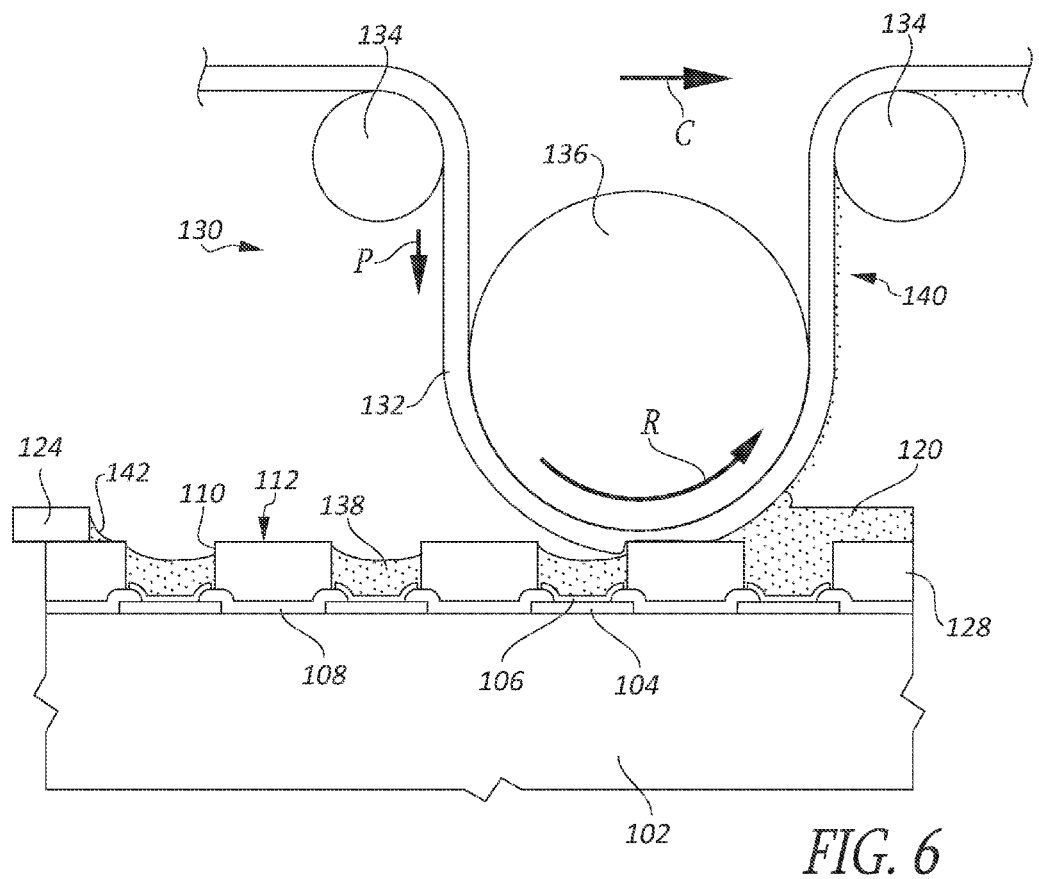

FIG. 6 is again a side diagrammatical view of the substrate 102. Following the deposition of the flux paste 120, the top face 112 of the resist layer 128 is cleaned. FIG. 6 shows one acceptable type of a cleaning mechanism 130 in which a web of cleaning paper 132 travels across a pair of transport rollers 134 and under a cleaning roller 136 in the direction indicated by the arrow P, so that the cleaning roller rotates, in the view of FIG. 6, in a counter-clockwise direction. The cleaning paper 132 is pressed against the top face of the resist layer 128 and is moved against the substrate by the rotation of the cleaning roller 136 to clean the flux paste 120 from the top face 112 of the resist layer 128. The entire mechanism 130, or at least the cleaning roller 136, moves along a line, relative to the substrate 102, in the direction indicated by the arrow C. Thus, as the cleaning roller 136 moves forward over the substrate 102, the cleaning paper 132 travels across the top face 112 of the resist layer 128, in the same direction, more quickly than the movement of the cleaning roller. The cleaning paper 132 therefore carries excess flux paste 120 forward, at 140, away from the substrate 102, leaving the top face 112 substantially clean.

The thickness, texture, and resiliency of the cleaning paper 132 can be selected so that as the paper passes across the openings 110 in the resist layer 128, flux paste 120 is removed from within the openings to a level that is somewhat below the top face 112. After the cleaning mechanism 130 passes, a deposit 138 of flux paste is left in each of the openings 110, while the top face is substantially clean. Small deposits 142 may remain in crevasses and tight spaces near the sealing ridges, but these will not interfere with the process, and will eventually be removed with the resist layer 128.

The cleaning paper 132 can be impregnated with an agent or combination of agents configured to improve the efficiency with which the flux paste is removed. Such agents can include, for example, water, detergent, solvents, mechanical abrasives, etc.

The transport and cleaning rollers 134, 136 can be journaled in bearings of a carriage positioned above the support on which the substrate rests. The carriage is then configured to travel on rails across the substrate. Feed and take-up rollers can also be journaled on the carriage, or can be in fixed positions at either end of the rails. Structures for transporting the cleaning roller over the substrate and for handling the cleaning paper, including the structure described above, are within the abilities of one of ordinary skill in the art, and are therefore not shown or described in detail.

According to an alternate embodiment, the top face 112 of the resist layer 128 is cleaned by a spray process. An appropriate solvent, such as, e.g., a mix of water and detergent, is sprayed onto the top face 112 to remove the excess flux paste. The volume, pressure, and duration of the spray are selected so that the top face 112 is cleaned, while a deposit 138 of flux paste is left in each of the openings 110.

Figure 7:
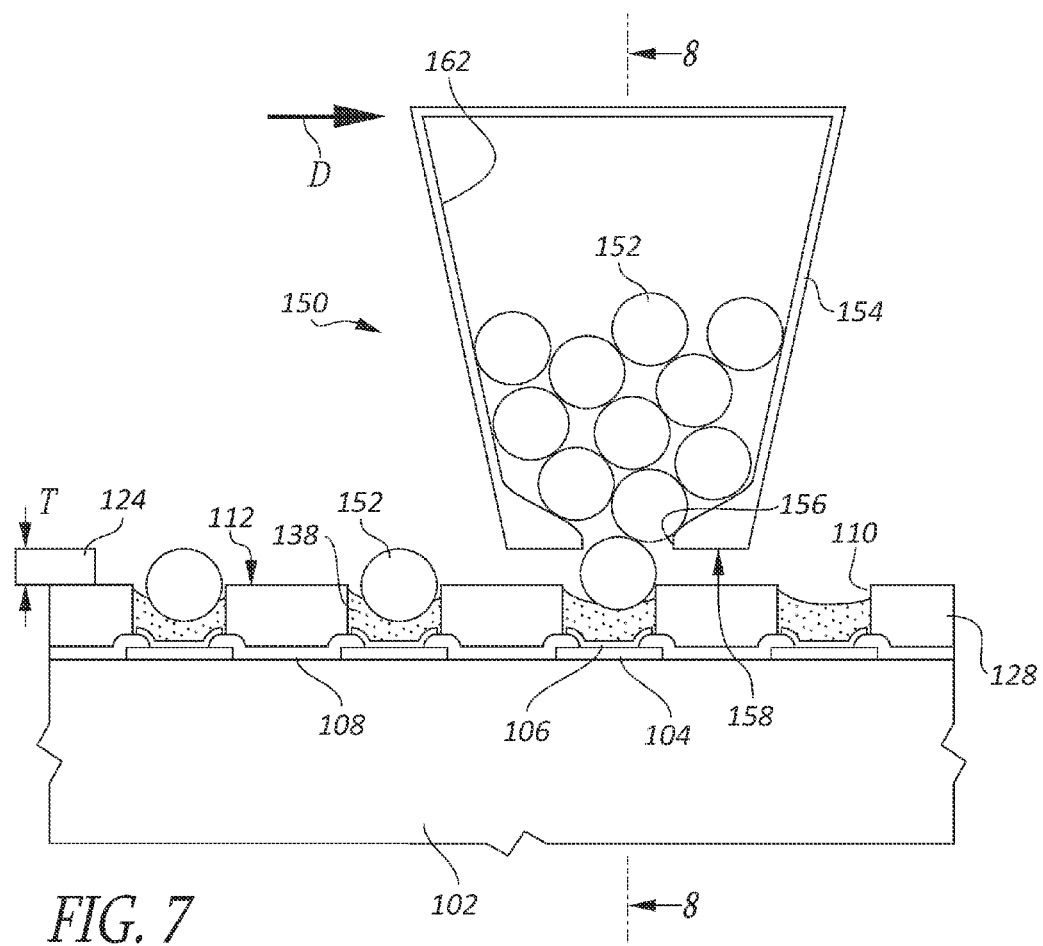
Figure 8A:
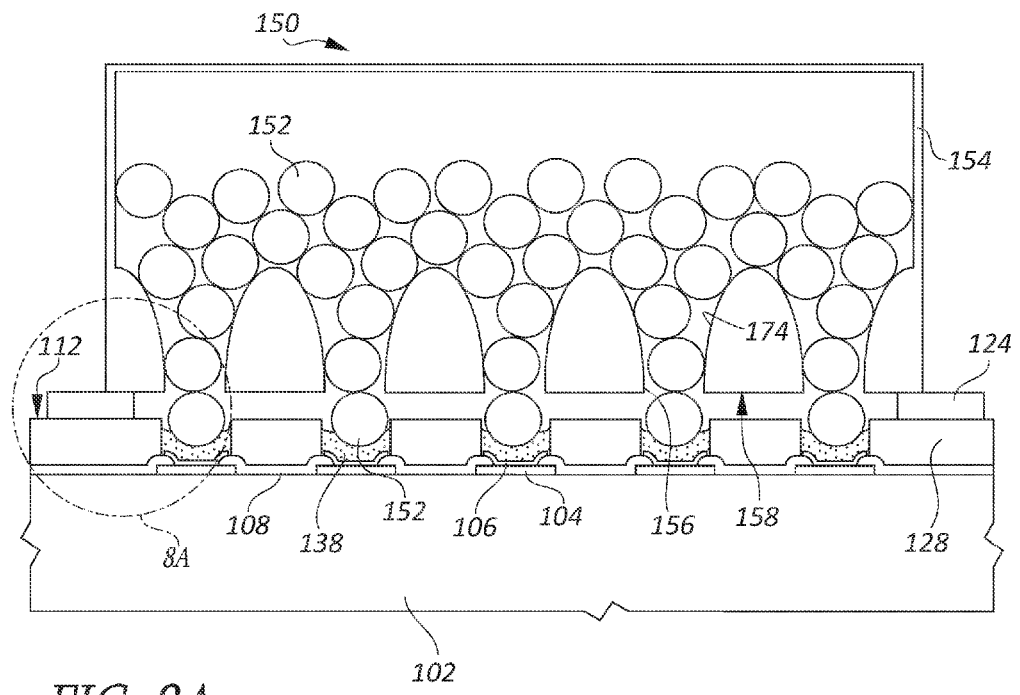
FIG. 8A is a diagrammatical front view of the substrate, taken along lines 8-8 of FIG. 7.

FIG. 7 is a diagrammatical side view showing a ball feeder 154 positioned over the substrate 102. FIG. 8A is a diagrammatical front view, taken along lines 8-8 of FIG. 7, also showing the substrate 102 and ball feeder 154. The ball feeder 154 includes a reservoir 162 in which a large number of solder balls 152 are carried. A single row of apertures 156 are provided in the bottom of the ball feeder 154, sized to permit the solder balls 152 to pass one at a time from the bottom of the ball feeder 154. Thus, the apertures 156 are larger than the diameter of the balls 152, but smaller than twice the diameter. The apertures 156 are spaced apart a distance that corresponds to a spacing of columns of the contact pads 104 of the substrate 102.

The ball feeder 154 preferably extends across the substrate 102 at least a distance sufficient to rest on sealing ridges 124 on opposite sides of the arrays, as shown in FIG. 8A, and travels, relative to the substrate 102, in the direction indicated by the arrow D of FIG. 7.

Because the ball feeder 154 slides along the sealing ridges 124, the thickness T of the ridges controls the distance between a bottom surface 158 of the ball feeder 154 and the top face 112 of the resist layer 128. According to an embodiment, the thickness T of the sealing ridges 124 is selected to hold the bottom face 158 of the ball feeder 154 a distance from the top face 112 that is less than the diameter of the solder balls 152. Thus, as the ball feeder 154 translates across the substrate 102, solder balls 152 cannot drop from the apertures 156 until the apertures pass over respective openings 110 of a row of openings in the resist layer 128. Because the deposit of flux paste 138 is below the level of the top face 112, the solder balls 152 can drop below the level of the bottom surface 158 of the ball feeder 154, or at least far enough that a solder ball remains in each opening 110 as the ball feeder passes.

The ball feeder 154 is shown in FIG. 8A as extending between two adjacent sealing ridges 124. According to an embodiment, a ball feeder is provided that extends across a plurality of arrays, bridging three or more sealing ridges. According to another embodiment, a ball feeder is provided that extends a full width of the substrate, so that a single pass of the ball feeder is sufficient to place a solder ball over each of the contact pads of the substrate. In one embodiment, the substrate is comprised of many hundreds of semiconductor die in an array that will later be singulated.

Figure 8B:
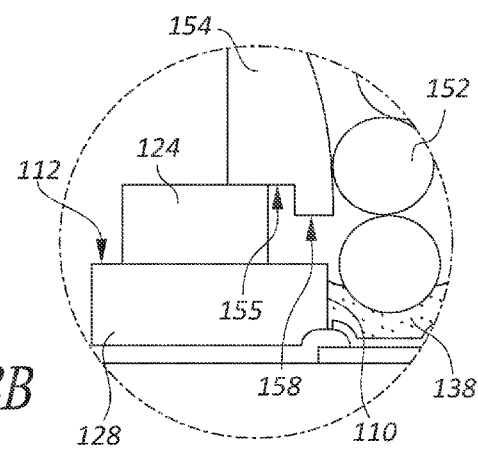
FIG. 8B is a detailed view of a substrate and mechanism, similar to that of FIG. 8A, according to an alternate embodiment taken at a position corresponding to 8B of FIG. 8A.

FIG. 8B is a detailed view of a substrate and mechanism, similar to that of FIG. 8A, according to an alternate embodiment taken at a position corresponding to 8B of FIG. 8A, in which the bottom surface 158 of the ball feeder 154 is offset below the level of an edge portion 155 of the feeder that rests on the sealing ridges 124. In this way, the bottom surface 158 can be maintained at a first height above the top face 112 of the resist layer, while the sealing ridges 124 can be positioned at a second height that is greater than the first height above the top face. This arrangement is beneficial, for example, where the squeegee used to apply the flux paste, as described above with reference to FIG. 5, is sufficiently flexible that, if the sealing ridges 124 had a height corresponding to the appropriate position of the bottom surface 158 of the ball feeder 154, the squeegee would make contact with the top face 112 of the resist layer 128, potentially damaging the resist layer. By raising the height of the sealing ridges 124, the resist layer 128 is better protected. Providing a correspondingly lowered bottom surface, proper delivery of the solder balls 152 is enabled. Other techniques can be used to position the ball feeder 154 the proper distance above the substrate, for example, a spacer carried on the ball feeder, a separate plate, or other tool.

FIGS. 9A-9C show, in side view, a sequence as the ball feeder 154 passes over an opening 110, according to an embodiment. In FIG. 9A, the ball feeder 154 is to the left of the opening 110. A solder ball 152a rests against the top face 112 of the resist layer 128. Because the solder ball 152a is still partially within the aperture 156, a trailing edge 170 of the aperture carries the ball forward as the ball carrier moves, causing the ball to roll along the top face 112.

When the ball feeder 154 passes over an opening 110, as shown in FIG. 9B, the solder ball 152a drops into the opening and onto the deposit of flux paste 138. Assuming that the solder ball 152a is still not completely out of the aperture 156, as the ball feeder 154 continues forward, the solder ball contacts the front edge of the opening 110 and is stopped, so that the ball feeder passes over.

In the embodiment shown, the bottom surface 158 of the ball feeder 154 includes a ramp formation 172. Namely, the surface 172 is not parallel to the surface 112, but is at an angle that is farther away from the surface 112 at the exit location. As shown in FIG. 9C, as the ball feeder 154 passes over the opening 110, the ramp formation 172 presses downward on the solder ball 152a that is trapped in the opening, pushing the ball down into the flux paste 138, which holds the ball firmly in place. Meanwhile the next solder ball 152b drops within the aperture to the top face 112, ready to be deposited into the next opening in line.

When the ball feeder 154 reaches the end of a row of arrays or a transverse sealing ridge, a vacuum can be drawn inside the reservoir, pulling, for example, the solder ball 154b back into the reservoir so that no balls are unintentionally dropped onto the top face 112 of the resist layer 128. Alternatively or in addition, a shutter can be provided to close the aperture 156.

The design and implementation of a mechanism for moving the ball feeder 154 as described above is within the abilities of a person of ordinary skill in the art. For example, movement in the X and Y axes can be by robotic control or can be driven by movement of a carriage on rails, while the ball feeder is coupled so as to move substantially freely in the Z axis, within a range of movement, in order to remain in contact with the sealing ridges, so that the correct spacing of the ball carrier above the resist layer is maintained.

After the ball feeder 154 has passed over all of the openings 110, an optical inspection can be performed to detect any openings in which no solder ball 152 was deposited. According to an embodiment, an automatic optical inspection system is programmed to detect the presence or absence of solder balls in the openings. The flux paste can be given a color that contrasts with the color of the solder balls, so that the appearance of an opening 110 with a solder ball in position can be easily distinguished from an opening that does not have a solder ball.

Additionally, if the material of the resist layer 128 is provided with a third color that contrasts with both the material of the solder balls and that of the flux paste, solder balls can be detected that are incorrectly positioned, i.e., that are on the top face 112 of the resist layer rather than in an opening. Bearing in mind that a solder ball having a diameter of 50 μm is smaller in diameter than the average human hair, contrasting colors, as described, can improve the efficiency of inspection and rework. Additionally, quantities of flux that were not properly removed from the top face 112 of the resist layer 128 during the cleaning process can also be detected.

Figure 10:
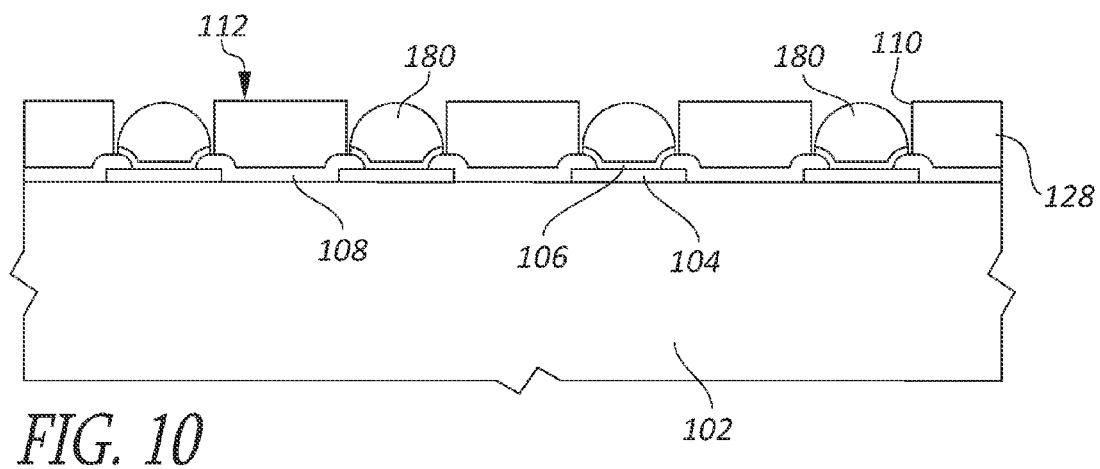

As shown in FIG. 10, after solder balls 152 have been positioned in the openings 110, the substrate is heated to melt and reflow the solder. During reflow, the oxides and other impurities are removed from the UBM 106 by the flux paste, providing a clean surface to which the solder can adhere. Most of the flux paste is consumed in this process, and the molten solder settles to the bottom of each opening 110, where it contacts the UBM 106 of the respective contact pad 104. The surface tension of the molten solder draws the solder into its most efficient shape, i.e., the shape that contains the solder with the smallest surface area. Thus, the solder forms a portion of a sphere, or "solder bump" 180 on each contact pad 104.

Figure 11:
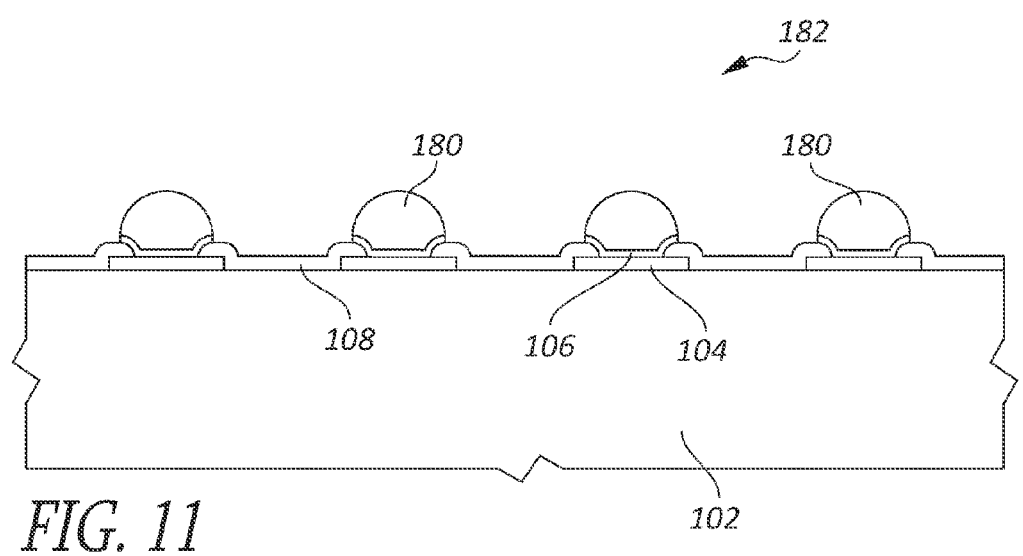

Once the solder bumps 180 are cooled and hardened, the resist layer 128 is removed, as shown in FIG. 11. Any flux residue is removed at the same time, along with seal ridges and anything else that is on the resist layer 128, leaving a ball grid array on the substrate 102. Subsequent steps, including singulation of the substrate to produce individual dice, are not shown or described in detail, but are well known in the art.

According to various embodiments, the sealing ridges described with reference to FIG. 4 are omitted from the process, and alternative means are provided for depositing a layer of flux and for controlling the spacing of the ball feeder. For example, according to an embodiment, flux paste is applied to the top face of the resist layer 128 using a screen printing process. In order to ensure that a sufficient quantity of flux paste is placed inside each opening 110, the screen printing process can be performed under a partial vacuum. The layer of paste that is screen printed onto the top face 112 bridges the openings 110, and when the vacuum is removed, the paste is pushed down into the openings by the returned air pressure against the vacuum that remains in the openings. According to other embodiments, flux is applied in a spin coating or spray coating process.

Figure 12:
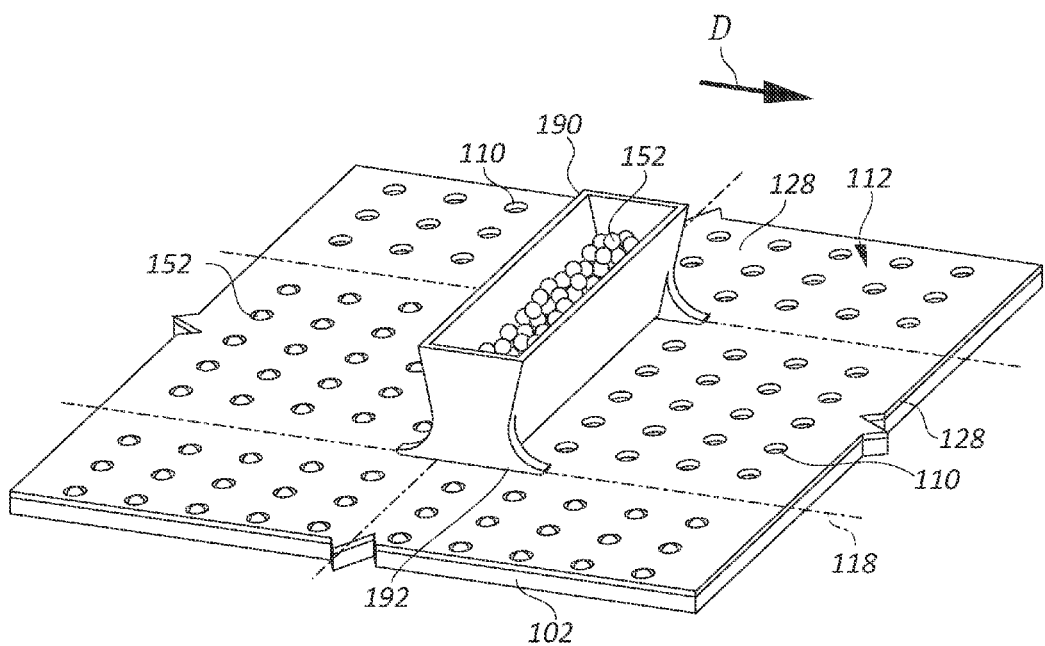
FIG. 12 is a perspective view of the wafer showing a ball feeder according to another embodiment.

FIG. 12 is a perspective view of the wafer 102 showing a ball feeder 190 according to another embodiment. The ball feeder 190 includes glide feet 192 that are spaced apart a distance that corresponds to kerf lines 118 of the substrate 102. In other respects, the ball feeder 190 is similar to the ball feeder 154 of FIGS. 7-9C. The glide feet 192 are configured to maintain a bottom surface of the ball feeder 190 a selected distance above a surface on which the ball feeder rests. According to an embodiment, that distance is selected to be between about 25% and 75% of the diameter of the solder balls 152 that the ball feeder 190 is configured to deposit.

According to an embodiment, the ball feeder 190 is made to slide on the glide feet in direction D over the top face 112 of the resist layer 128, with the glide feet aligned with and moving along kerf lines 118. As the ball feeder 190 passes over the openings 110, solder balls 152 are deposited in each opening, substantially as described previously. Upon completion of a row, the ball feeder 190 is made to slide along an adjacent row, until a solder ball 152 is deposited in each of the openings 110 of the substrate.

According to another embodiment, the ball feeder has a width that is at least equal to a total width of the substrate, so that a single pass of the ball feeder over the substrate is sufficient to deposit a solder ball into each opening.

It is preferred that the position of the bottom surface of the ball feeder be controlled with direct reference to the top surface of the resist layer, because of the very small size of the solder balls, and the function served by the spacing of the ball feeder in delivering solder balls to the openings of the resist layer. Accordingly, in the embodiments disclosed above, the ball feeder rests on sealing ridges of a selected height, or rests directly on the resist layer. However, according to other embodiments, the ball feeder is supported independent of the substrate and resist layer, and is transported across the substrate without making direct contact, supported, for example, by a carriage traveling on rails. In such alternative embodiments, the spacing can be controlled using optical rangefinding systems, feeler contact mechanisms, or other known mechanisms for detecting the position of a surface.

The layer 128 of the drawings is described as a resist layer, primarily because many known resist materials can be used satisfactorily in the processes described. However, this layer can be any material that can perform the functions defined by the claims. Thus, unless so defined, the "resist layer" need not be specifically resistant to etch chemicals, solvents, or other substances commonly associated with resist materials.

In describing the embodiments illustrated in the drawings, directional references, such as right, left, top, bottom, front, back, etc., are used to refer to elements or movements as they are shown in the figures. Such terms are used to simplify the description and are not to be construed as limiting the claims in any way.

Ordinal numbers, e.g., first, second, third, etc., are used according to conventional claim practice, i.e., for the purpose of clearly distinguishing between claimed elements or features thereof. The use of such numbers does not suggest any other relationship, e.g., order of operation or relative position of such elements. Furthermore, ordinal numbers used in the claims have no specific correspondence to those used in the specification to refer to elements of disclosed embodiments on which those claims read.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The unit symbol "µm" is used herein to refer to a value in microns. One micron is equal to $1 \times 10^{-6}$ meters.

U.S. patent application Ser. No. 12/977,697 filed on Dec. 23, 2010, in which the present applicant is named as a co-inventor, and U.S. patent application Ser. No. 13/232,780, filed Sep. 14, 2011, by the present applicant, are directed to subject matter that has some technical overlap with the subject matter of the present disclosure, and are incorporated herein in their entireties.

Elements of the various embodiments described above can be combined, and further modifications can be made, to provide further embodiments without deviating from the spirit and scope of the invention. All of the U.S. patents and U.S. patent applications referred to in this specification are incorporated herein by reference, in their entireties. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. A method, comprising:
    positioning a resist layer on a surface of a substrate having a plurality of contact pads thereon;
    defining a plurality of openings in the resist layer, each opening positioned over a respective one of the plurality of contact pads;
    depositing flux paste in each of the plurality of openings;
    positioning a solder ball in each of the plurality of openings in contact with the flux paste deposited in the respective opening by moving a ball feeder across the substrate, the ball feeder having a plurality of apertures spaced apart a distance that corresponds to a spacing, in one dimension, of the contact pads of the substrate, and dropping a single solder ball in each of the plurality of openings in the resist layer as the ball feeder moves across the respective openings;
    forming solder bumps on each of the plurality of contact pads by reflowing the plurality of solder balls in the respective openings; and
    removing the resist layer after reflowing the solder balls.

2. The method of claim 1 wherein the depositing flux paste comprises depositing a layer of flux paste over substantially an entire surface of the resist layer, and removing flux paste from the surface of the resist layer except a portion of the flux paste that remains in each of the plurality of openings.

3. The method of claim 2 wherein the depositing a layer of flux paste comprises drawing flux paste across the surface of the resist layer with a squeegee.

4. The method of claim 3, comprising positioning sealing ridges on the surface of the resist layer, followed by the drawing flux paste across the surface of the resist layer, a thickness of the layer of flux paste being defined by a height of the sealing ridges above the surface of the resist layer.

5. The method of claim 2 wherein the depositing a layer of flux paste comprises applying flux paste in a spin coat process.

6. The method of claim 2 wherein the depositing a layer of flux paste comprises applying flux paste in a spray process.

7. The method of claim 2 wherein the removing flux paste from the surface of the resist layer comprises moving a cleaning mechanism across the substrate, with a continuous web of a cleaning material being passed over the surface of the resist layer and drawing away the flux paste.

8. The method of claim 1, comprising positioning a plurality of sealing ridges on the surface of the resist layer, and wherein the moving a ball feeder across the substrate comprises positioning the ball feeder to span at least two adjacent ones of the plurality of sealing ridges and moving the ball feeder along the sealing ridges over the resist layer.

9. The method of claim 1 wherein the positioning a solder ball in each of the plurality of openings in contact with the flux paste comprises dropping a solder ball into each of the plurality of openings, and pressing the solder ball into the flux paste positioned in the respective opening.

10. A method for forming a ball grid array on a semiconductor device, comprising:
    positioning a resist layer on a substrate of the semiconductor device;
    defining a plurality of openings in the resist layer;
    positioning a solder ball in each of the plurality of openings by moving a ball feeder across the substrate, the ball feeder having a plurality of apertures spaced apart a distance that corresponds to a spacing, in one dimension, of the openings, and dropping a single solder ball in each of the plurality of openings in the resist layer as the ball feeder moves across the respective openings; and forming a solder bump on a contact pad corresponding to each of the plurality of openings by reflowing the plurality of solder balls in the respective openings.

11. The method of claim 10, comprising depositing flux in each of the plurality of openings prior to position a solder ball in each of the plurality of openings.

12. The method of claim 11 wherein the depositing flux comprises depositing a layer of flux over the resist layer, and cleaning flux from a surface of the resist layer while leaving flux in each of the openings.

13. The method of claim 10 wherein the positioning a solder ball in each of the plurality of openings comprises moving a ball feeder across the resist layer so that feed apertures of the ball feeder align, in sequence, with individual rows of the openings.

14. A method comprising:
positioning a solder ball in each of a plurality of openings formed in a resist layer, each opening being spaced above a respective contact pad of an integrated circuit package, the positioning including:
by moving a ball feeder across the substrate, the ball feeder having a plurality of apertures spaced apart a distance that corresponds to a spacing, in one dimension, of the contact pads of the substrate; and
dropping solder balls from the apertures of openings in the resist layer as the ball feeder moves across the respective openings; and
forming solder bumps on the contact pads corresponding to each of the plurality of openings by reflowing the plurality of solder balls in the respective openings.

15. The method of claim 14 comprising, prior to positioning the solder balls in the openings, depositing flux paste in each of the plurality of openings.

\* \* \* \* \*